United States Patent
Yabe (10) Patent No.: US 7,301,129 B1
(45) Date of Patent: Nov. 27, 2007

(54) CONTROL CIRCUIT FOR SEMICONDUCTOR DEVICE HAVING OVERHEATING PROTECTION FUNCTION

(75) Inventor: Hiroo Yabe, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/711,822

(22) Filed: Feb. 28, 2007

(30) Foreign Application Priority Data

Feb. 28, 2006 (JP) .............................. 2006-051662

(51) Int. Cl.
*H05B 1/02* (2006.01)
(52) U.S. Cl. .................. 219/505; 219/501; 219/508; 219/497; 361/93.8; 374/101; 438/660
(58) Field of Classification Search ............... 219/505, 219/494, 497, 501, 504, 508, 209, 210; 361/98.3; 374/101; 438/660
See application file for complete search history.

(56) References Cited

U.S. PATENT DOCUMENTS 5,563,759 A * 10/1996 Nadd .......................... 361/101
6,731,023 B2 * 5/2004 Rothleitner et al. .......... 307/64
2001/0038518 A1 * 11/2001 Yamaji ....................... 361/93.8

FOREIGN PATENT DOCUMENTS

JP                3585105  B2      8/2004

* cited by examiner

*Primary Examiner*—Mark Paschall
(74) *Attorney, Agent, or Firm*—Sughrue Mion, PLLC (57) ABSTRACT

A control circuit includes a drive circuit which applies a drive voltage to a semiconductor device having an overheating protection function according to an externally supplied signal; and a current detecting circuit which outputs a detection signal when a drive current flowing through the semiconductor device exceeds a predetermined threshold current. The semiconductor device incorporates a semiconductor element, a temperature detecting circuit for detecting temperature increase of a chip, and an interrupting circuit for interrupting an input to the semiconductor element according to a detection output of the temperature detecting circuit. The drive circuit turns off the semiconductor element and changes the drive voltage to a predetermined voltage so that the drive current exceeds the threshold current when the interrupting circuit interrupts an input to the semiconductor element, and keeps the drive voltage at the predetermined voltage while the detection signal is output from the current detecting circuit.

3 Claims, 6 Drawing Sheets

CONTROL CIRCUIT FOR SEMICONDUCTOR DEVICE HAVING OVERHEATING PROTECTION FUNCTION

BACKGROUND OF THE INVENTION

The present invention relates to a control circuit for a semiconductor device having an overheating protection function for preventing breaking, due to overheating, of a power semiconductor element that is used for driving a vehicular lamp, for example.

A control circuit for a semiconductor device having an overheating protection function is known which includes a semiconductor device having an overheating protection function, an output state detecting means, and a control means. The semiconductor device having an overheating protection function is such that a semiconductor element such as a MOSFET, a temperature detecting circuit, a latch circuit, and a gate interrupting circuit are incorporated in one chip. The temperature detecting circuit detects temperature increase of the chip and supplies a detection output to the latch circuit. The latch circuit latches the detection output of the temperature detecting circuit. Controlled by the output of the latch circuit, the gate interrupting circuit interrupts a gate input to the semiconductor element. The output state detecting means detects the output state of the semiconductor device having an overheating protection function.

Being a CPU (central processing unit) or the like, the control means supplies a PWM (pulse width modulation) control signal to the semiconductor element and monitors the detection output of the output state detecting means regularly with monitoring timing that is each rise time point of the PWM control signal plus a prescribed time. The control means compares the logic value (1 or 0) of the detection output of the output state detecting means and that of the PWM control signal, and performs a control so as to stop supplying the PWM control signal to the semiconductor element if a state that the logic value of the detection output of the output state detecting means is different from that of the PWM control signal occurs consecutively a predetermined number of times or over a prescribed time (refer to Patent document 1, for example).

[Patent document 1] JP-B-3,585,105 (claim 1, paragraphs [0002]-[0012] and [0024]-[0033], FIG. 1)

In the above conventional control circuit for a semiconductor device having an overheating protection function, the output terminal voltage of the semiconductor element is supplied to the control means through an interconnection that extends from the semiconductor device having an overheating protection function to the dedicated control means for monitoring the semiconductor device. And an overheating/cutoff state of the semiconductor device having an overheating protection function is detected by measuring the output terminal voltage of the semiconductor element with the control means. This results in problems that the circuit is complex and large in size and hence the control circuit for the semiconductor device having an overheating protection function is expensive.

In the above conventional control circuit for the semiconductor device having an overheating protection function, to judge whether to stop supplying the PWM control signal to the semiconductor element, supply of the PWM control signal and a protecting operation are performed several times repeatedly. This results in a problem that deterioration due to overheating of the semiconductor element progresses though slightly.

Furthermore, in the above conventional control circuit for the semiconductor device having an overheating protection function, a control may be performed in such a manner that the supply of the PWM control signal to the semiconductor element is stopped because the control means operates erroneously due to disturbance noise though the semiconductor element is not overheated and cut off. There is a problem that this no load current comes to flow through a load and, if the load is a lamp, the lamp is turned off.

SUMMARY OF THE INVENTION

The present invention has been made in the above circumstances, and an object of the invention is to provide a control circuit for a semiconductor device having an overheating protection function which can solve the above problems.

In order to achieve the above object, according to the present invention, there is provided a control circuit for controlling a semiconductor device having an overheating protection function, the semiconductor device which incorporates, in one chip, a semiconductor element, a temperature detecting circuit for detecting temperature increase of the chip, and an interrupting circuit for interrupting an input to the semiconductor element according to a detection output of the temperature detecting circuit, the control circuit comprising:

a drive circuit which applies a drive voltage to the semiconductor device according to an externally supplied signal; and a current detecting circuit which outputs a detection signal when a drive current flowing through the semiconductor device exceeds a predetermined threshold current, wherein the drive circuit turns off the semiconductor element and changes the drive voltage to a predetermined voltage so that the drive current exceeds the threshold current when the interrupting circuit interrupts an input to the semiconductor element, and keeps the drive voltage at the predetermined voltage while the detection signal is output from the current detecting circuit.

Preferably, the drive circuit stops applying the drive voltage to the semiconductor device when supply of power from a power source is shut off or a reset signal is externally supplied to the drive circuit.

Preferably, the current detecting circuit is configured so as to be able to output the detection signal to the outside.

According to the invention, neither a control unit that is dedicated to monitoring of the semiconductor device having an overheating protection function nor an interconnection extending from the semiconductor device having an overheating protection function to such a control unit is necessary. As a result, the circuit can be made simple and small in size and hence the control circuit for a semiconductor device having an overheating protection function can be produced at a low cost. Further, deterioration of the semiconductor element due to overheating can be minimized to enhance the reliability of the semiconductor element. Furthermore, even if the current detecting circuit outputs a detection signal due to disturbance noise, the drive circuit keeps the drive voltage at the prescribed voltage, which prevents trouble that no drive current flows through a load.

As such, the invention can provide a control circuit for a semiconductor device having an overheating protection function which has high reliability that the probability of breaking of the semiconductor element is very low and which operates reliably, though it is simple in configuration. Therefore, where the semiconductor device having an overheating protection function is used for driving of a vehicle lamp, for example, occurrence of a fire in the vehicle can be prevented.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Embodiment 1

Figure 1:
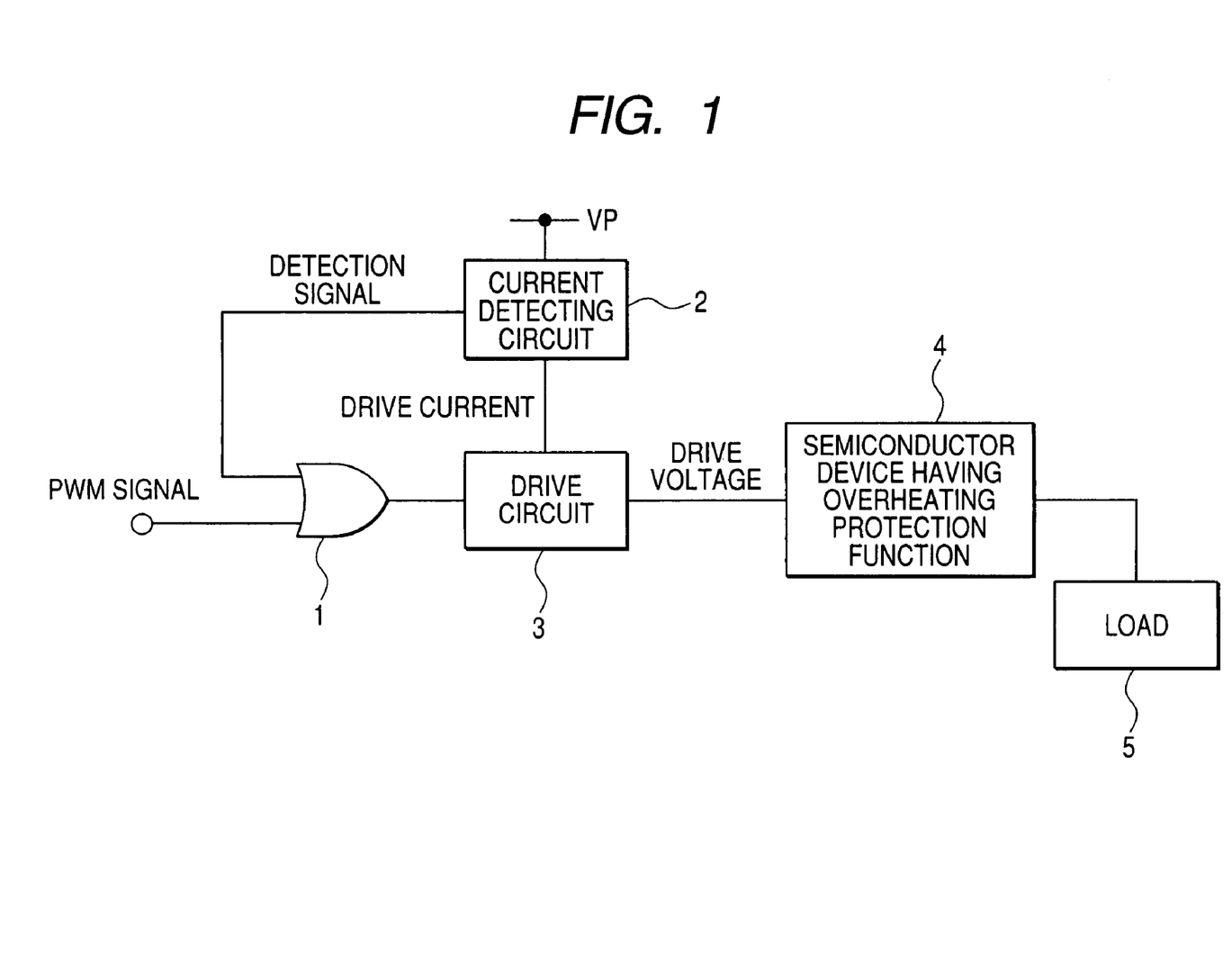
FIG. 1 is a block diagram showing the configuration of a control circuit for a semiconductor device having an overheating protection function according to a first embodiment of the present invention.

FIG. 1 is a block diagram showing the configuration of a control circuit for a semiconductor device 4 having an overheating protection function according to a first embodiment of the present invention. The control circuit of the semiconductor device 4 having an overheating protection function of this example generally includes an OR gate 1, a current detecting circuit 2, a drive circuit 3, and the semiconductor device 4 having an overheating protection function.

The OR gate 1 supplies the drive circuit 3 with a logical value (H-level of L-level) that is the OR of a PWM signal (H-level of L-level) supplied externally and a detection signal (H-level of L-level) supplied from the current detecting circuit 2. The current detecting circuit 2 outputs an H-level detection signal VDEC if a drive current that flows from a VP power source to the semiconductor device 4 having an overheating protection function via the drive circuit 3 exceeds a preset threshold current.

The drive circuit 3 amplifies the logical value supplied from the OR gate 1 and applies a resulting drive voltage to the semiconductor device 4 having an overheating protection function. If the supply of power from the VP power source is shut off, the drive circuit 3 stops applying the drive voltage to the semiconductor device 4 having an overheating protection function. The semiconductor device 4 having an overheating protection function is configured in such a manner that a semiconductor element, a temperature detecting circuit, an interrupting circuit, etc. are provided in one chip. The semiconductor device 4 having an overheating protection function supplies a load current to a load 5 while the drive circuit 3 applies the drive voltage to it.

Figure 2:
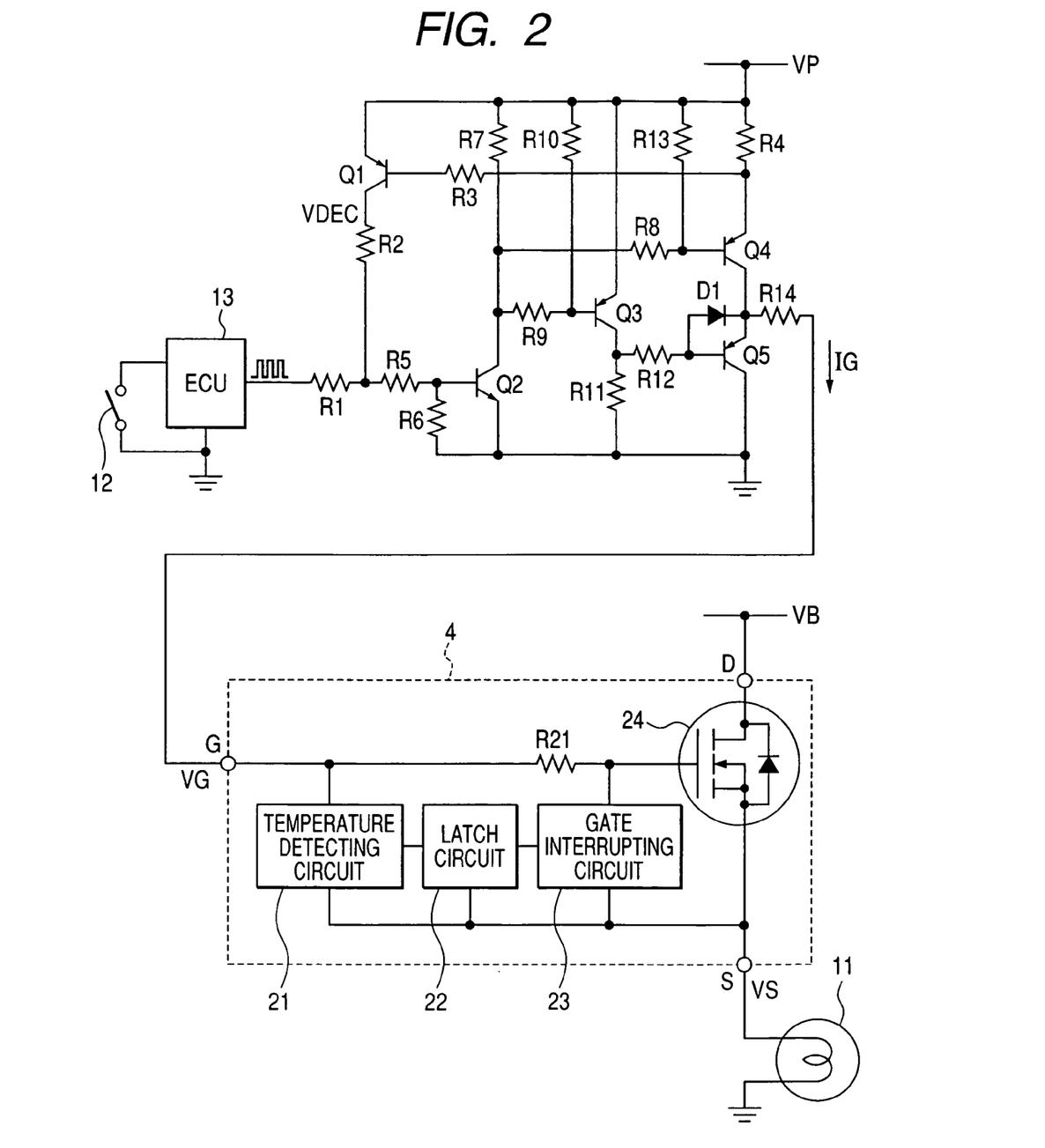
FIG. 2 is a specific circuit diagram showing the configuration of the control circuit for the semiconductor device having an overheating protection function shown in FIG. 1.

FIG. 2 is a circuit diagram as a more specific version of FIG. 1, which is the block diagram of the control circuit for the semiconductor device 4 having an overheating protection function. The control circuit for the semiconductor device 4 having an overheating protection function of this example is a device (high-side switching device) in which an n-channel MOSFET 24 is disposed upstream of a lamp 11 which is the load 5. The control circuit for the semiconductor device 4 having an overheating protection function of this example is provided in an automobile, for example. In FIG. 2, the load 5 shown in FIG. 1 is the lamp 11 that is used in, for example, a winker (flasher) for producing a signal indicating a turn.

As shown in FIG. 2, when the driver of the automobile manipulates a switch 12, a PWM signal that is output from an ECU (electronic control unit) 13 is supplied to the control circuit. The duty cycle of the PWM signal is set in advance. The ECU 13 controls the engine of the automobile by determining a fuel injection rate, ignition timing, etc. The ECU 13 further controls the automatic transmission and performs a traction control etc. In the first embodiment, a CPU that is necessary conventionally as a device dedicated to a control circuit for a semiconductor device having an overheating protection function is not necessary.

Referring to FIG. 2, resistors R1 and R2 constitute the OR gate 1 shown in FIG. 1. A pnp transistor Q1 and resistors R3 and R4 constitute the current detecting circuit 2 shown in FIG. 1. An npn transistor Q2, pnp transistors Q3-Q5, resistors R5-R14, and a diode D1 constitute the drive circuit 3 shown in FIG. 1. The diode D1 is provided to protect the base of the transistor Q5.

A temperature detecting circuit 21, a latch circuit 22, a gate interrupting circuit 23, the n-channel MOSFET 24, and a gate resistor R21 constitute the semiconductor device 4 having an overheating protection function shown in FIG. 1. The temperature detecting circuit 21, the latch circuit 22, the gate interrupting circuit 23, the MOSFET 24, and the gate resistor R21 are incorporated in one chip.

Connected between a gate terminal G of the semiconductor device 4 having an overheating protection function and the source of the MOSFET 24, the temperature detecting circuit 21 detects temperature increase of the chip and supplies a detection output to the latch circuit 22. The latch circuit 22 latches the detection output of the temperature detecting circuit 21. Connected between the gate and the source of the MOSFET 24, the gate interrupting circuit 23 is turned on being controlled by the output of the latch circuit 22 and interrupts the gate input by short-circuiting the gate and the source of the MOSFET 24. The gate resistor R21 is connected between the gate of the MOSFET 24 and the gate terminal G of the semiconductor device 4 having an overheating protection function. The drain of the MOSFET 24 is connected to a drain terminal D, to which a VB voltage is applied, of the semiconductor device 4 having an overheating protection function and its source is connected to a source terminal S of the semiconductor device 4 having an overheating protection function. The overheating protection function of the semiconductor device 4 having an overheating protection function is implemented through cooperation of the temperature detecting circuit 21, the latch circuit 22, the gate interrupting circuit 23, and the gate resistor R21.

Figure 3:
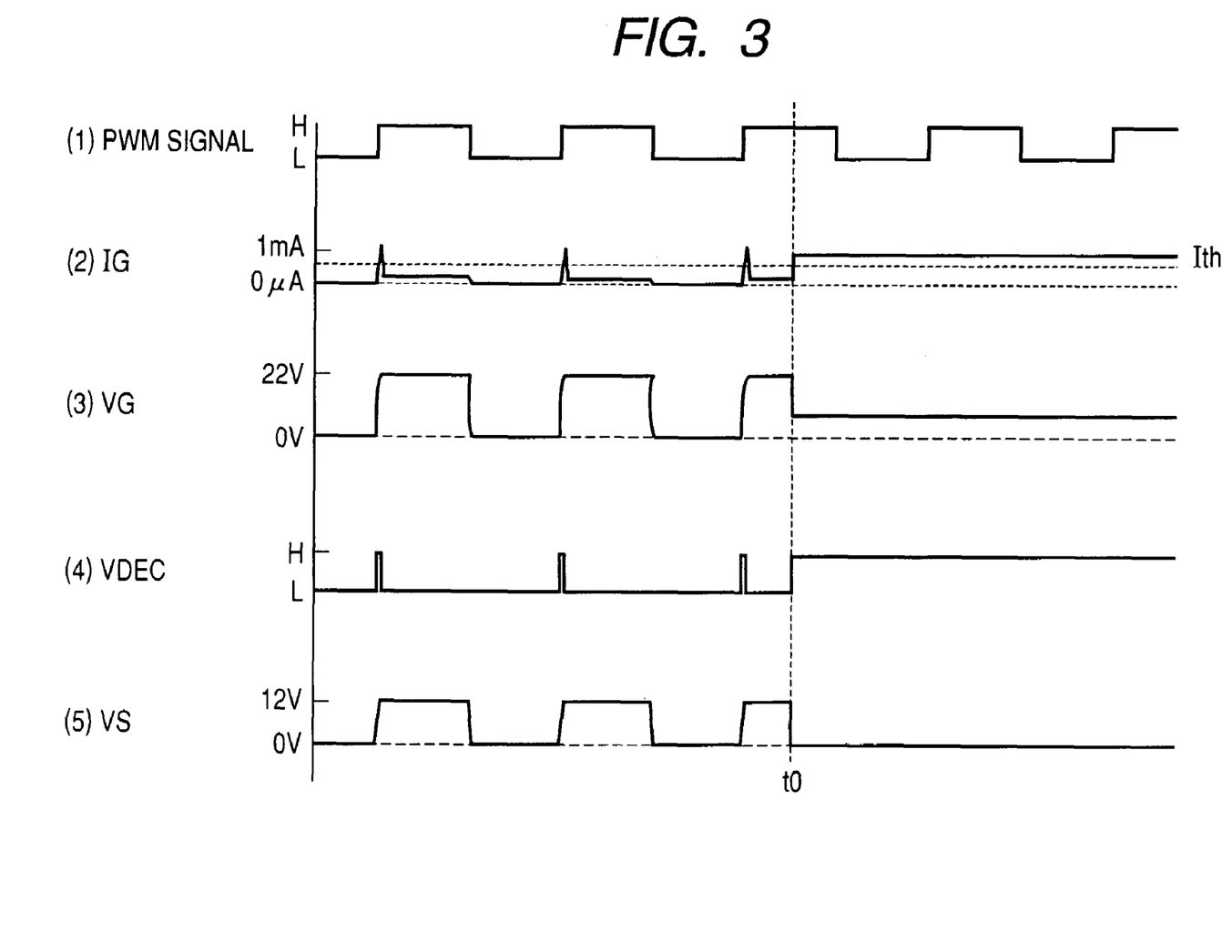
FIG. 3 is a waveform diagram showing the operation of the control circuit for the semiconductor device having an overheating protection function shown in FIG. 2.

Next, the operation of the above-configured control circuit for the semiconductor device 4 having an overheating protection function will be described with reference to a waveform diagram of FIG. 3. In FIG. 3(2), symbol $I_{th}$ denotes a threshold current to be used for detecting cutoff of the MOSFET 24 due to overheating. It is assumed that the VP voltage is 12 V, the VB voltage is 22 V, and the resistance values of the resistors R4 and R14 and the gate resistor R21 are 1.2 kΩ, 10 kΩ, and 10 kΩ, respectively.

In an ordinary operation state, when a PWM signal shown in FIG. 3(1) is supplied from the ECU 13, the PWM signal appears as it is at the connecting point of the resistors R1 and R2 which constitute the OR gate 1. When the logical value of the PWM signal turns to the H-level, the transistor Q2 is turned on and hence the collector voltage of the transistor Q2 becomes equal to the L-level, whereby the transistors Q3 and Q4 are turned on simultaneously. As a result, the base voltage of the transistor Q5 increases, whereby the transistor Q5 is turned on and a gate current IG flows from the VP power source along the path consisting of the resistor R4, the emitter and the collector of the transistor Q4, and the resistor R14 (see FIG. 3(2)). In the semiconductor device 4 having an overheating protection function, gate capacitances $C_{GS}$ and $C_{GD}$ of the MOSFET 24 are charged up via the gate resistor R21.

As the charging continues, the gate-source voltage $V_{GS}$ of the MOSFET 24 increases and the MOSFET 24 is turned on when it exceeds the threshold voltage. As a result, the voltage VG at the gate terminal G of the semiconductor device 4 having an overheating protection function increases to about 22 V (see FIG. 3(3)) and the voltage VS at the source terminal S of the semiconductor device 4 having an overheating protection function increases to about 12 V (see FIG. 3(5)). A load current thus flows through the load 5 which is the lamp 11 in this case.

A gate current IG of about 1 mA flows through the gate of the MOSFET 24 for several microseconds to tens of microseconds in a turning-on initial period of the MOSFET 24 (see FIG. 3(2)). The gate current IG of about 1 mA exceeds the above-mentioned threshold current $I_{th}$ that is used by the current detecting circuit 2 to detect cutoff of the MOSFET 24 due to overheating. In the period when this gate current IG flows, the voltage drop across the resistor R4 which is part of the current detecting circuit 2 is higher than the base-emitter voltage $V_{BE}$ of the transistor Q1 which is about 0.7 V, whereby the transistor Q1 is turned on and the VP voltage (H-level) appears at the collector of the transistor Q1. That is, the current detecting circuit 2 outputs an H-level detection signal VDEC (see FIG. 3(4)). However, in the period when this gate current IG flows, as described above, the logic value of the PWM signal is at the H-level. Therefore, the voltage at the connecting point of the resistors R1 and R2 which constitute the OR gate 1 remains the H level and hence does not influence the on-operation of the MOSFET 24 at all.

On the other hand, in an ordinary operation state, when the logic value of the PWM signal turns to the L-level, the transistor Q2 is turned off and hence the collector voltage of the transistor Q2 becomes equal to the VP voltage, whereby the transistors Q3 and Q4 are turned off simultaneously. As a result, the base of the transistor Q5 is pulled down to the ground via the resistors R11 and R12. Therefore, the transistor Q5 is turned on and the emitter potential of the transistor Q5 becomes equal to the pn junction forward voltage (about 0.7 V (L-level)). Therefore, a discharge current flows from the gate of the MOSFET 24 along the path consisting of the gate resistor R21, the resistor R14, and the emitter and the collector of the transistor Q5 (see FIG. 3(2)). The charge stored in the gate of the MOSFET 24 is thus released to the ground.

As this discharge continues, the gate-source voltage $V_{GS}$ of the MOSFET 24 decreases and the MOSFET 24 is turned off when it becomes lower than the threshold voltage. As a result, the voltage VG at the gate terminal G of the semiconductor device 4 having an overheating protection function falls to about 0 V (see FIG. 3(3)) and the voltage VS at the source terminal S of the semiconductor device 4 having an overheating protection function also falls to about 0 V (see FIG. 3(5)). No load current thus flows through the load 5 which is the lamp 11 in this case.

When the logical value of the PWM signal is at the L-level, the voltage drop across the resistor R4 which is part of the current detecting circuit 2 does not exceed the base-emitter voltage $V_{BE}$ of the transistor Q1 which is about 0.7 V. Therefore, the transistor Q1 is kept off and the current detecting circuit 2 continues to output an L-level detection signal VDEC (see FIG. 3(4)). Therefore, the voltage at the connecting point of the resistors R1 and R2 which constitute the OR gate 1 remains the L-level and does not influence the off-operation of the MOSFET 24 at all.

The above-described operation is performed repeatedly, whereby the lamp 11 is driven so as to flash according to the PWM signal supplied.

If an abnormal state such as short-circuiting occurs in the lamp 11 as the load 5 while the control circuit is operating in the above-described manner and the logical value of the PWM signal is at the H-level, a large current flows between the drain and the source of the MOSFET 24 and the chip temperature is thereby increased. The increase in chip temperature is detected by the temperature detecting circuit 21, and a resulting detection output of the temperature detecting circuit 21 is latched by the latch circuit 22 and then supplied to the gate interrupting circuit 23. The gate interrupting circuit 23 is turned on being controlled by the output of the latch circuit 22 and performs a protecting operation so as to interrupt the gate input (at time $t_0$ in FIG. 3).

When the gate interrupting circuit 23 is turned on, the gate and the source of the MOSFET 24 is short-circuited, whereby a gate current IG flows from the VP power source along the path consisting of the resistor R4, the emitter and the collector of the transistor Q4, the resistor R14, the gate resistor R21, and the gate interrupting circuit 23. In this example, the VP voltage is 12 V, the VB voltage is 22 V, and the resistance values of the resistors R4 and R14 and the gate resistor R21 are 1.2 kΩ, 10 kΩ, and 10 kΩ, respectively. Therefore, the gate current IG is about 1 mA (see FIG. 3(2)) and the voltage VG at the gate terminal G of the semiconductor device 4 having an overheating protection function falls from about 22 V to about 10 V (=(about 1 mA)×10 kΩ) (see FIG. 3(3)).

Since the voltage VG at the gate terminal G of the semiconductor device 4 having an overheating protection function falls from about 22 V to about 10 V, the charge stored in the gate of the MOSFET 24 is released and the MOSFET 24 is thereby turned off. As a result, the voltage VS at the source terminal S of the semiconductor device 4 having an overheating protection function falls from about 12 V to about 0 V (see FIG. 3(5)). Therefore, the large current no longer flows between the drain and the source of the MOSFET 24 and the chip temperature decreases. As a result, the MOSFET 24 is prevented from being broken due to temperature increase.

At this time, since the gate current IG of about 1 mA flows through the resistor R4 which is part of the current detecting circuit 2, the voltage drop across the resistor R4 becomes about 1.2 V which is higher than the base-emitter voltage $V_{BE}$ (about 0.7 V) of the transistor Q1 and hence the transistor Q1 is turned on. The VP voltage (H-level) appears at the collector of the transistor Q1. That is, the current detecting circuit 2 outputs an H-level detection signal VDEC (see FIG. 3(4)).

Even if the logic value of the PWM signal changes from the H-level to the L-level in this state, since the H-level detection signal VDEC is being applied, from the current detecting circuit 2, to the one end of the resistor R2 which is part of the OR gate 1, the voltage at the connecting point of the resistors R1 and R2 which constitute the OR gate 1 remains the H-level. Therefore, the transistors Q2-Q4 which are part of the drive circuit 3 are kept on and the transistor Q5 is kept off. Therefore, the gate current IG of about 1 mA continues to flow through the semiconductor device 4 having an overheating protection function (see FIG. 3(2)) and the voltage VG at the gate terminal G remains about 10 V (see FIG. 3(3)). That is, the semiconductor device 4 having an overheating protection function continues the interrupting operation.

From this time onward, even if the logical value of the PWM signal changes from the L-level to the H-level or vice versa, the OR gate 1, the current detecting circuit 2, and the drive circuit 3 perform the above-described operation and hence the semiconductor device 4 having an overheating protection function continues the interrupting operation.

There may occur a case that the semiconductor device 4 having an overheating protection function is heated externally and the chip temperature increases in a state that the logical value of the PWM signal is at the L-level. However, even if the chip temperature exceeds a heating threshold value of the temperature detecting circuit 21, the voltage VG at the gate terminal G of the semiconductor device 4 having an overheating protection function remains about 0.7 V. Therefore, the temperature detecting circuit 21, the latch circuit 22, and the gate interrupting circuit 23, which are internal circuits of the semiconductor device 4 having an overheating protection function, are each kept non-operational.

If the logical value of the PWM signal then turns to the H-level in the state that the chip temperature to be detected by the temperature detecting circuit 21 is higher than the heating threshold value, the chip temperature is detected by the temperature detecting circuit 21. A detection output of the temperature detecting circuit 21 is latched by the latch circuit 22 and then supplied to the gate interrupting circuit 23. The gate interrupting circuit 23 which is being controlled by the output of the latch circuit 22 is turned on and performs a protecting operation for interrupting the gate input.

The above-described interrupting operation of the semiconductor device 4 having an overheating protection function can be canceled by setting the VP voltage lower than the threshold voltage of the transistors Q3 and Q4. If the VP voltage is set lower than the threshold voltage of the transistors Q3 and Q4, the transistors Q3 and Q4 are turned off. When the transistor Q4 is turned off, the gate current IG no longer flows. On the other hand, when the transistor Q3 is turned off, the base of the transistor Q5 is pulled down to the ground via the resistors R11 and R12.

Since the transistor Q4 is turned off and the base of the transistor Q5 is pulled down to the ground via the resistors R11 and R12, the transistor Q5 is turned on and the emitter potential of the transistor Q5 becomes equal to about 0.7 V, which is the pn junction forward voltage. Therefore, the voltage VG at the gate terminal G of the semiconductor device 4 having an overheating protection function also falls to about 0.7 V via the resistor R14. As a result, the temperature detecting circuit 21, the latch circuit 22, and the gate interrupting circuit 23, which are internal circuits of the semiconductor device 4 having an overheating protection function, are rendered non-operational. That is, the detection output is reset in the temperature detecting circuit 21. In the latch circuit 22, the detection output of the temperature detecting circuit 21 that has been latched inside is reset. Since the latch circuit 22 is reset, the gate interrupting circuit 23 is turned off and stops the gate input interrupting operation.

A description will now be made of a method for setting the above-mentioned threshold current $I_{th}$. As described above, when the MOSFET 24 is turned on, a gate current IG flows from the VP power source to the gate of the MOSFET 24 via the resistor R4, the emitter and the collector of the transistor Q4, the resistor R14, and the gate resistor R21 of the semiconductor device 4 having an overheating protection function to charge up gate capacitances $C_{GS}$ and $C_{GD}$ of the MOSFET 24 (see FIG. 3(2). At this time, parts of the gate current IG flow through, as operation currents, the temperature detecting circuit 21, the latch circuit 22, and the gate interrupting circuit 23, which are internal circuits of the semiconductor device 4 having an overheating protection function. The peak value of the gate current IG is equal to about 1 mA.

After the MOSFET 24 has been turned on, inside the semiconductor device 4 having an overheating protection function, the gate current IG does not flow through the gate resistor R21 or the gate of the MOSFET 24 and merely flows through the temperature detecting circuit 21, the latch circuit 22, and the gate interrupting circuit 23 as operation currents. In this state, the gate current IG is equal to about 50 μA.

On the other hand, when the semiconductor device 4 having an overheating protection function performs an interrupting operation, the gate interrupting circuit 23 is turned on to short-circuit the gate and the source of the MOSFET 24. Therefore, a gate current IG flows from the VP power source to the semiconductor device 4 having an overheating protection function along the path including the resistor R4, the emitter and the collector of the transistor Q4, and the resistor R14. Inside the semiconductor device 4 having an overheating protection function, the gate current IG flows along the path including the gate resistor R21 and the gate interrupting circuit 23 and the path including the temperature detecting circuit 21, the latch circuit 22, and the gate interrupting circuit 23. In this case, the value of the gate current IG is determined by the combined resistance of the resistance component of the current detecting circuit 2 and the resistance of the gate resistor R21 and is equal to about 1 mA.

It is concluded from the above discussion that, in principle, satisfactory results can be obtained as long as the threshold current $I_{th}$ is set between about 50 μA and about 1 mA. For example, it may be set at 500 μA. Specific consideration will be given to a threshold current value $I_{th}$ that should be set when the VP voltage is 12 V and the resistor R4 has a resistance value 1.2 kΩ. Assume that the transistor Q1 is turned on when its base-emitter voltage $V_{BE}$ is higher than about 0.65 V. Then, for the current detecting circuit 2 to detect cutoff of the MOSFET 24 due to overheating, a gate current IG of 540 μA (=0.65 V/1.2 kΩ) needs to flow. This gate current IG includes a base current of the transistor Q4. If it is assumed to be 40 μA, a true threshold current $I_{th}$ is calculated as 500 μA.

As described above, according to the first embodiment of the invention, the OR gate 1, the current detecting circuit 2, and the drive circuit 3 are provided and the drive circuit 3 applies a gate voltage VG to the semiconductor device 4 having an overheating protection function according to the externally supplied PWM signal and the detection signal VDEC which turns to the H-level when the gate current IG which is supplied to the semiconductor device 4 having an overheating protection function exceeds the preset threshold current $I_{th}$. If the supply of power from the VP power source is shut off, the drive circuit 3 stops applying the gate voltage VG to the semiconductor device 4 having an overheating protection function.

Therefore, according to the first embodiment of the invention, unlike in the conventional control circuit for a semiconductor device having an overheating protection function disclosed in the above-mentioned Patent document 1, neither the control means that is dedicated to the monitoring of the semiconductor device having an overheating protection function nor the interconnection extending from the semiconductor device having an overheating protection function to the control means is necessary. As a result, the circuit can be made simple and small in size and hence the control circuit for a semiconductor device having an overheating protection function can be produced at a low cost.

According to the first embodiment of the invention, once the gate interrupting circuit 23 performs a protecting operation, the MOSFET 24 will not be turned on any more. Therefore, deterioration of the MOSFET 24 due to overheating can be minimized to enhance the reliability of the MOSFET 24. Furthermore, according to the first embodiment of the invention, even if the current detecting circuit 2 outputs an H-level detection signal VDEC due to disturbance noise though the MOSFET 24 is not cut off due to overheating, the drive circuit keeps, at about 10 V, the voltage VG at the gate terminal G of the semiconductor device 4 having an overheating protection function, which prevents trouble that the lamp 11 is turned off.

As such, the first embodiment of the invention can provide a control circuit for a semiconductor device having an overheating protection function which has high reliability that the probability of breaking of the MOSFET 24 is very low and which operates reliably, though it is simple in configuration. Therefore, where the semiconductor device having an overheating protection function is used for driving of a vehicle lamp, for example, occurrence of a fire in the vehicle can be prevented.

Embodiment 2

Figure 4:
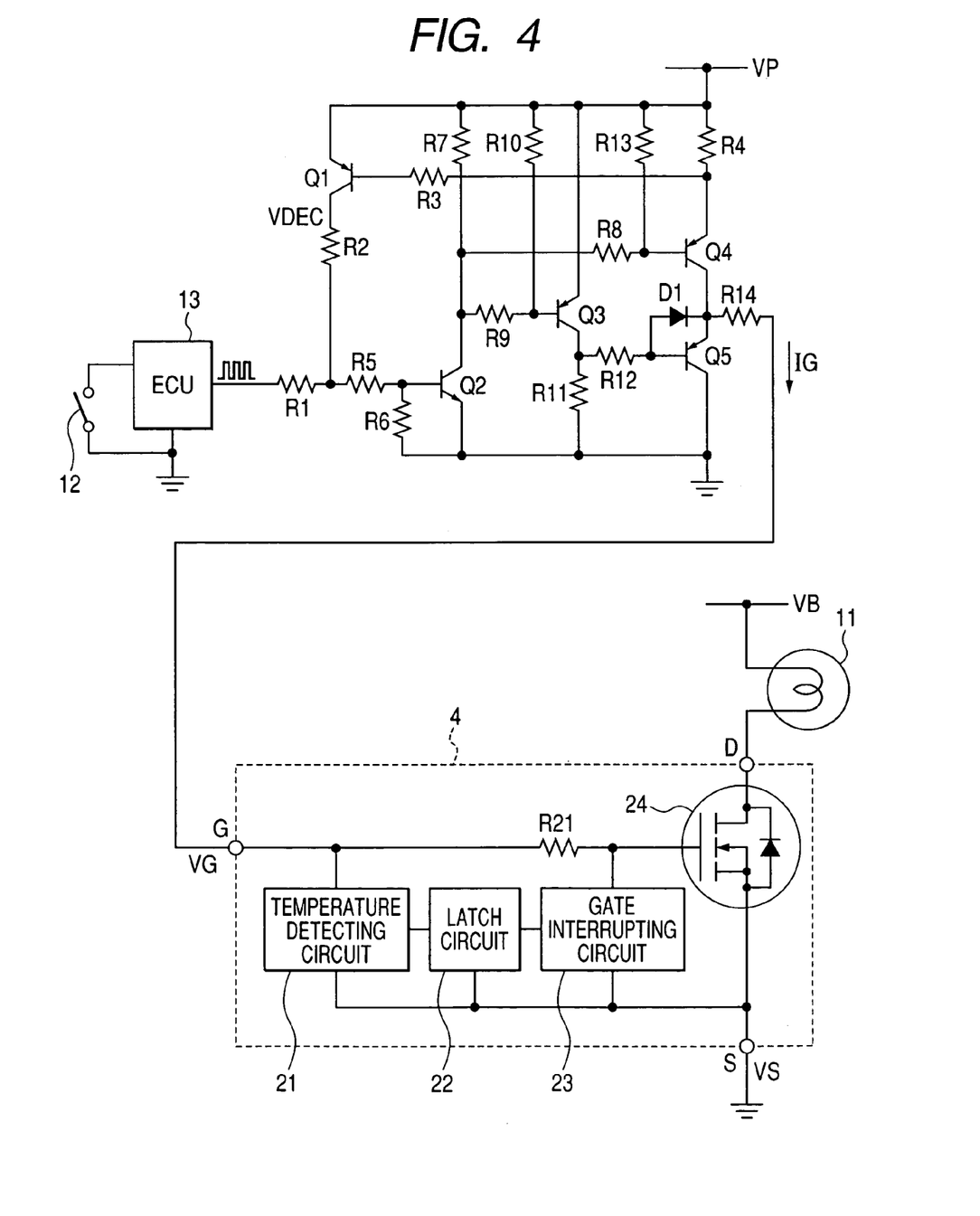
FIG. 4 is a circuit diagram showing the configuration of a control circuit for a semiconductor device having an overheating protection function according to a second embodiment of the invention.

FIG. 4 is a circuit diagram showing the configuration of a control circuit for a semiconductor device 4 having an overheating protection function according to a second embodiment of the invention. In FIG. 4, components having corresponding components in FIG. 2 are given the same reference symbols as the latter and will not be described. The control circuit for the semiconductor device 4 having an overheating protection function shown in FIG. 4 is different from that shown in FIG. 2 only in that the lamp 11 is provided between the VB power source and the drain terminal D of the semiconductor device 4 having an overheating protection function. The control circuit for the semiconductor device 4 having an overheating protection function of this example operates approximately in the same manner as in the first embodiment and hence its operation will not be described.

As described above, according to the second embodiment of the invention, the invention can be applied to the device (low-side switching device) in which the n-channel MOSFET 24 is provided downstream of the lamp 11 as a load, in the same form as in the first embodiment.

Embodiment 3

Figure 5:
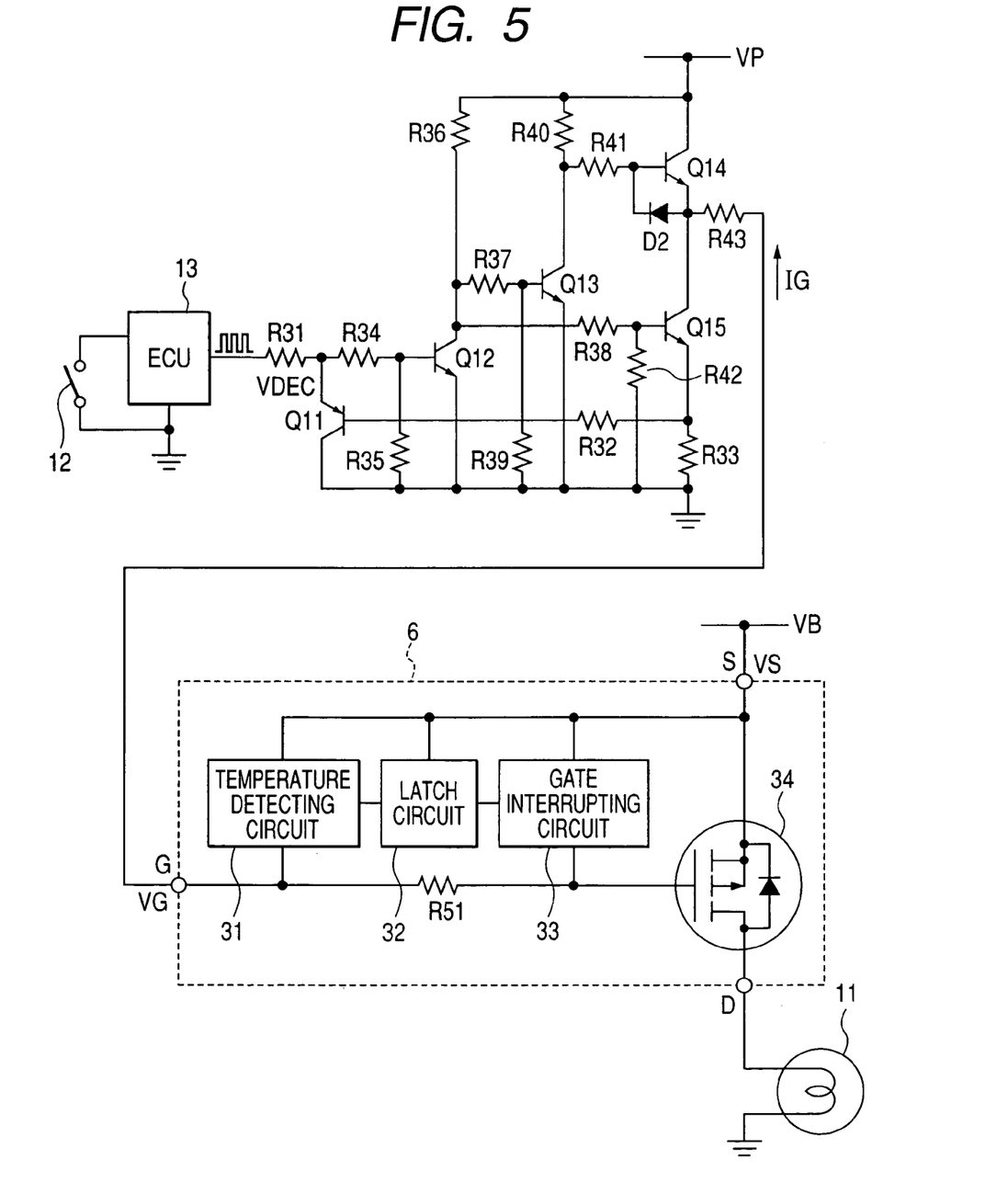
FIG. 5 is a circuit diagram showing the configuration of a control circuit for a semiconductor device having an overheating protection function according to a third embodiment of the invention.

FIG. 5 is a circuit diagram showing the configuration of a control circuit for a semiconductor device 6 having an overheating protection function according to a third embodiment of the invention. In FIG. 5, components having corresponding components in FIG. 2 are given the same reference symbols as the latter and will not be described. The control circuit for the semiconductor device 6 having an overheating protection function of this example is a device (high-side switching device) in which a p-channel MOSFET 34 is disposed upstream of a lamp 11 as a load. The control circuit for the semiconductor device 6 having an overheating protection function of this example is incorporated in an automobile, for example. In FIG. 5, the load is the lamp 11 that is used in, for example, a winker (flasher) for producing a signal indicating a turn.

In FIG. 5, a resistor R31 and a pnp transistor Q11 constitute an OR gate. The pnp transistor Q11 and resistors R32 and R33 constitute a current detecting circuit. And npn transistors Q12-Q15, resistors R34-R43, and a diode D2 constitute a drive circuit. The diode D2 is provided to protect the base of the transistor Q14.

A temperature detecting circuit 31, a latch circuit 32, a gate interrupting circuit 33, the p-channel MOSFET 34, and a gate resistor R51 constitute the semiconductor device 6 having an overheating protection function. The temperature detecting circuit 31, the latch circuit 32, the gate interrupting circuit 33, the MOSFET 34, and the gate resistor R51 are provided in one chip.

Connected between a gate terminal G of the semiconductor device 6 having an overheating protection function and the source of the MOSFET 34, the temperature detecting circuit 31 detects temperature increase of the chip and supplies a resulting detection output to the latch circuit 32. The latch circuit 32 latches the detection output of the temperature detecting circuit 31. Connected between the gate and the source of the MOSFET 34, the gate interrupting circuit 33 is turned on being controlled by the output of the latch circuit 32 and interrupts the gate input by short-circuiting the gate and the source of the MOSFET 34. The gate resistor R51 is connected between the gate of the MOSFET 34 and the gate terminal G of the semiconductor device 6 having an overheating protection function. The drain of the MOSFET 34 is connected to a drain terminal D of the semiconductor device 6 having an overheating protection function and its source is connected to a source terminal S, to which a VB voltage is applied, of the semiconductor device 6 having an overheating protection function. The overheating protection function of the semiconductor device 6 having an overheating protection function is implemented through cooperation of the temperature detecting circuit 31, the latch circuit 32, the gate interrupting circuit 33, and the gate resistor R51.

Next, the operation of the above-configured control circuit for the semiconductor device 6 having an overheating protection function will be outlined. In an ordinary operation state, when the logical value of a PWM signal turns to the L-level, the transistor Q12 is turned off. Therefore, the transistors Q13 and Q15 are turned on simultaneously and the transistor Q14 is turned off. As a result, a gate current IG flows from the gate of the MOSFET 34 which is part of the semiconductor device 6 having an overheating protection function along the path consisting of the gate resistor R51, the resistor R43, the collector and the emitter of the transistor Q15, and the resistor R33, whereby the MOSFET 34 is turned on. A load current thus flows through the lamp 11.

On the other hand, in an ordinary operation, when the logical value of the PWM signal turns to the H-level, the transistor Q12 is turned on. Therefore, the transistors Q13 and Q15 are turned off simultaneously and the transistor Q14 is turned on. As a result, a gate current IG flows from the VP power source along the path consisting of the collector and the emitter of the transistor Q14 and the resistor R43, whereby the MOSFET 34 is turned off. No load current thus flows through the lamp 11.

The above-described operation is performed repeatedly, whereby the lamp 11 is driven so as to flash according to the PWM signal supplied.

If an abnormal state such as short-circuiting occurs in the lamp 11 while the logical value of the PWM signal is at the L-level, a large current flows between the source and the drain of the MOSFET 34 and the chip temperature is thereby increased. The increase in chip temperature is detected by the temperature detecting circuit 31, and a resulting detection output of the temperature detecting circuit 31 is latched by the latch circuit 32 and then supplied to the gate interrupting circuit 33. The gate interrupting circuit 33 is turned on being controlled by the output of the latch circuit 32 and performs a protecting operation so as to interrupt the gate input.

When the gate interrupting circuit 33 is turned on, the gate and the source of the MOSFET 34 is short-circuited, whereby a gate current IG flows from the VB power source along the path consisting of the source and the gate of the MOSFET 34, the gate resistor R51, the resistor R43, the collector and the emitter of the transistor Q1, and the collector and the emitter of the transistor Q15. As a result, the voltage VG at the gate terminal G of the semiconductor device 6 having an overheating protection function increases.

Since the voltage VG at the gate terminal G of the semiconductor device 6 having an overheating protection function increases, the MOSFET 34 is turned off. As a result, the large current no longer flows between the drain and the source of the MOSFET 34 and the chip temperature decreases. As a result, the MOSFET 34 is prevented from being broken due to temperature increase.

At this time, the gate current IG that flows through the resistor R33 which is part of the current detecting circuit exceeds a threshold voltage to be used by the current detecting circuit to detect cutoff of the MOSFET 34 due to overheating. Therefore, the transistor Q11 is turned on to pull down the connecting point of the resistors R31 and R34.

Even if the logic value of the PWM signal changes from the L-level to the H-level in this state, since the connecting point of the resistors R31 and R34 is pulled down by the transistor Q11, the voltage at the connecting point of the resistors R31 and R34 remains the L-level. Therefore, the transistors Q12 and Q14 are kept off and the transistors Q13 and Q15 are kept on. Therefore, the gate current IG that exceeds the threshold current continues to flow through the semiconductor device 6 having an overheating protection function and the semiconductor device 6 having an overheating protection function maintains the interrupting operation. Even if the logical value of the PWM signal thereafter changes from the H-level to the L-level or vice versa, the above-described operation is performed and hence the semiconductor device 6 having an overheating protection function maintains the interrupting operation.

As described above, according to the third embodiment of the invention, the invention can also be applied to the device (high-side switching device) in which the p-channel MOSFET 34 is provided upstream of the lamp 11 as a load.

Embodiment 4

Although the above embodiments are directed to the case that the semiconductor device having an overheating protection function incorporates the latch circuit, the invention is not limited to such a case. For example, the invention can also be applied to a semiconductor device 7 having an automatic-recovery-type overheating protection function shown in FIG. 6. The semiconductor device 7 incorporates, instead of the latch circuit 22 shown in FIG. 2, a threshold value switching circuit 42 for switching the threshold value of the temperature that is detected by a temperature detecting circuit 41. A gate interrupting circuit 43 performs an interrupting operation if the temperature detected by the temperature detecting circuit 41 is higher than 150° C., and cancels the interrupting operation if the temperature detected by the temperature detecting circuit 41 becomes lower than 120° C.

Figure 6:
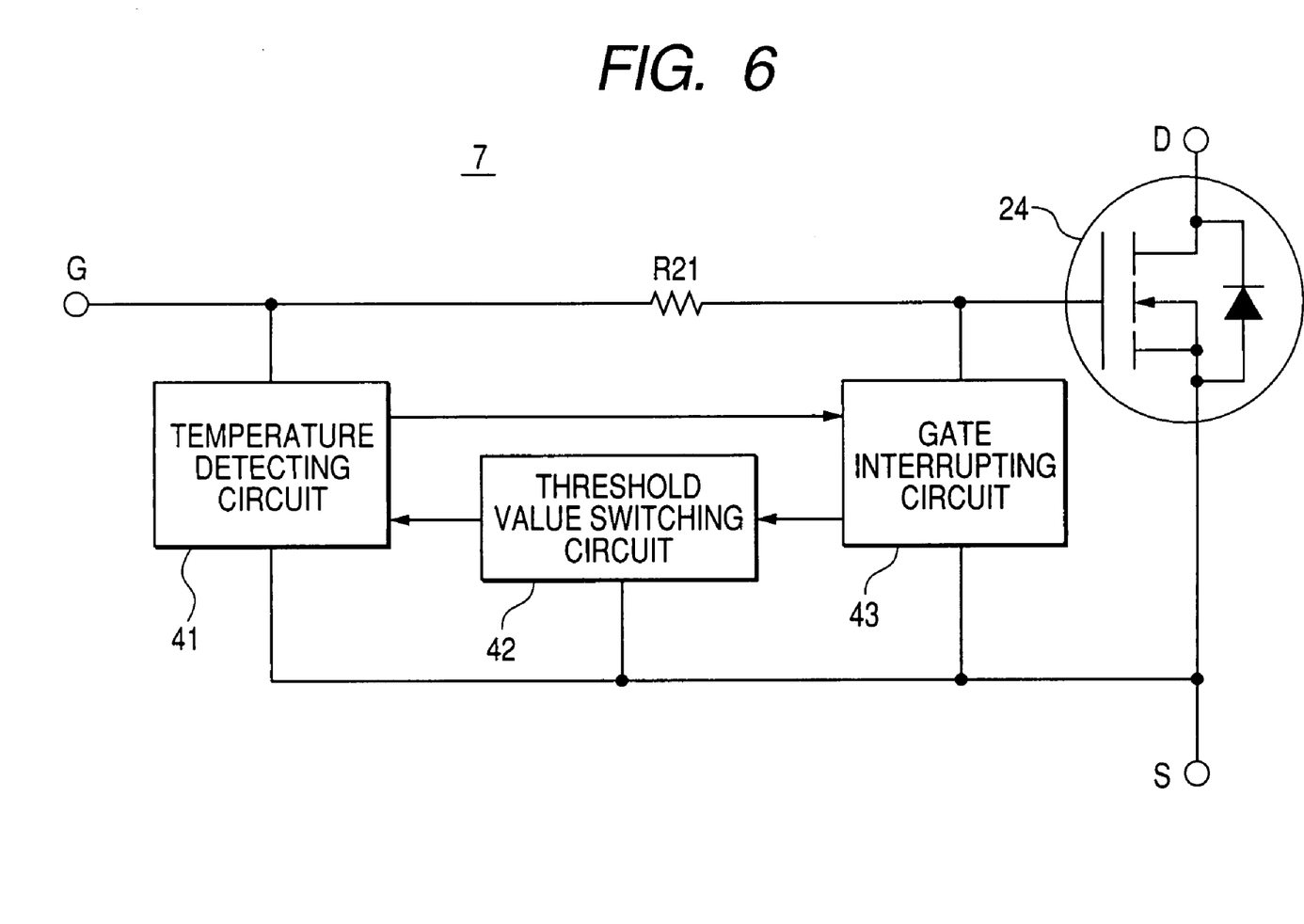
FIG. 6 is a block diagram showing the configuration of a control circuit for a semiconductor device having an automatic-recovery-type overheating protection function.

In this case, while the semiconductor device 7 having an overheating protection function is performing an interrupting operation, it maintains the interrupting operation even if a PWM signal is supplied externally. However, when the gate interrupting circuit 43 has canceled the interrupting operation because the chip temperature has been decreased by the interrupting operation, a drive is performed so that the lamp 11 is flashed according to the PWM signal which is supplied externally. That is, this embodiment dispenses with the operation of canceling an interrupting operation on the semiconductor device 7 having an overheating prevention function such as making the VP voltage lower than the threshold voltage of the transistors Q3 and Q4 as described in the first embodiment.

Although the embodiments of the invention have been described above in detail with reference to the drawings, the specific configuration is not limited to the ones described in the embodiments and the invention encompasses design modifications etc. that are within the spirit and scope of the invention.

For example, the following configuration is possible. In the above-described first embodiment, a reset circuit for short-circuiting the base and the emitter of the transistor Q2 is added inside the drive circuit 3 which is composed of the transistors Q2-Q5, the resistors R5-R14, and the diode D1 (see FIG. 2). To cancel an interrupting operation of the semiconductor device having an overheating protection function, a reset signal is supplied from the ECU 13. This configuration makes it possible to cancel an interrupting operation of the semiconductor device having an overheating protection function more easily.

In the above-described first embodiment, a detection signal VDEC of the current detecting circuit 2 may be output to the outside so as to be used for another control.

Although in each of the above embodiments a PWM signal is supplied from the ECU 13, the invention is not limited to such a case. Any kind of signal may be supplied externally as long as its logical value varies between the H-level and the L-level.

Although in each of the above embodiments the semiconductor element which is part of the semiconductor device having an overheating protection function is the MOSFET, the invention is not limited to such a case. The semiconductor element may be a bipolar transistor.

The techniques of each of the above described embodiments may be used in another embodiment as long as no discrepancy or problem arises in the object, the configuration, or some other points.

The present application is based on Japan Patent Application No. 2006-051662 filed on Feb. 28, 2006, the contents of which are incorporated herein for reference.

[FIG. 1]
2: CURRENT DETECTING CIRCUIT
3: DRIVE CIRCUIT
4: SEMICONDUCTOR DEVICE HAVING OVERHEATING PROTECTION FUNCTION
5: LOAD
A: PWM SIGNAL
B: DETECTION SIGNAL
C: DRIVE CURRENT
D: DRIVE VOLTAGE

[FIG. 2]
21: TEMPERATURE DETECTING CIRCUIT
22: LATCH CIRCUIT
23: GATE INTERRUPTING CIRCUIT

[FIG. 3]
PWM SIGNAL

[FIG. 4]
21: TEMPERATURE DETECTING CIRCUIT
22: LATCH CIRCUIT
23: GATE INTERRUPTING CIRCUIT

[FIG. 5]
31: TEMPERATURE DETECTING CIRCUIT
32: LATCH CIRCUIT
33: GATE INTERRUPTING CIRCUIT

[FIG. 6]
41: TEMPERATURE DETECTING CIRCUIT
42: THRESHOLD VALUE SWITCHING CIRCUIT
43: GATE INTERRUPTING CIRCUIT

What is claimed is:

1. A control circuit for controlling a semiconductor device having an overheating protection function, the semiconductor device which incorporates, in one chip, a semiconductor element, a temperature detecting circuit for detecting temperature increase of the chip, and an interrupting circuit for interrupting an input to the semiconductor element according to a detection output of the temperature detecting circuit, the control circuit comprising:

a drive circuit which applies a drive voltage to the semiconductor device according to an externally supplied signal; and a current detecting circuit which outputs a detection signal when a drive current flowing through the semiconductor device exceeds a predetermined threshold current, wherein the drive circuit turns off the semiconductor element and changes the drive voltage to a predetermined voltage so that the drive current exceeds the threshold current when the interrupting circuit interrupts an input to the semiconductor element, and keeps the drive voltage at the predetermined voltage while the detection signal is output from the current detecting circuit.

2. The control circuit according to claim 1, wherein the drive circuit stops applying the drive voltage to the semiconductor device when supply of power from a power source is shut off or a reset signal is externally supplied to the drive circuit.

3. The control circuit according to claim 1, wherein the current detecting circuit is configured so as to be able to output the detection signal to the outside.

* * * * *